United States Patent
Nguyen et al.

(10) Patent No.: US 6,329,224 B1
(45) Date of Patent: Dec. 11, 2001

(54) ENCAPSULATION OF MICROELECTRONIC ASSEMBLIES

(75) Inventors: Tan Nguyen; Craig S. Mitchell, both of Santa Clara; Thomas H. Distefano, Monte Sereno, all of CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 09/067,698

(22) Filed: Apr. 28, 1998

(51) Int. Cl.[7] .................................................. H01L 21/44
(52) U.S. Cl. ............................ 438/127; 438/29; 438/126; 438/111; 438/114
(58) Field of Search ............................. 438/29, 126, 127, 438/128, FOR 367, 111, 112, 113, 114

(56) References Cited

U.S. PATENT DOCUMENTS

| | | | |
|---|---|---|---|
| 4,822,550 | * 4/1989 | Komathu | 264/263 |
| 4,890,383 | 1/1990 | Lumbard et al. | 29/841 |
| 4,996,170 | 2/1991 | Baird | 437/219 |
| 5,037,779 | * 8/1991 | Whalley et al. | 437/211 |
| 5,093,281 | 3/1992 | Eshima | 437/219 |
| 5,158,912 | * 10/1992 | Kellerman et al. | 437/218 |
| 5,258,650 | 11/1993 | Polak et al. | 257/788 |
| 5,349,234 | 9/1994 | DesJardin et al. | 257/684 |
| 5,369,058 | 11/1994 | Burns et al. | 437/209 |
| 5,376,588 | 12/1994 | Pendse | 437/211 |
| 5,477,611 | * 12/1995 | Sweis et al. | 29/840 |
| 5,607,882 | * 3/1997 | Lambert et al. | 437/209 |
| 5,700,723 | * 12/1997 | Barber | 437/214 |
| 5,715,594 | * 2/1998 | Patterson et al. | 29/842 |
| 5,765,692 | * 6/1998 | Schenz | 206/713 |
| 5,766,987 | * 6/1998 | Mitchell et al. | 438/126 |
| 5,923,959 | * 7/1999 | Mess | 438/126 |
| 6,020,218 | * 2/2000 | Shim et al. | 438/111 |

FOREIGN PATENT DOCUMENTS

| | | | |
|---|---|---|---|
| 56-081957 | * 7/1981 | (JP) | H01L/21/56 |
| 60-193365 | * 10/1985 | (JP) | H01L/21/60 |
| 03108745 | * 5/1991 | (JP) | H01L/23/28 |
| 04312965 | * 11/1992 | (JP) | H01L/25/065 |
| WO 97/11486 | 3/1997 | (WO) . | |

* cited by examiner

Primary Examiner—Matthew Smith
Assistant Examiner—Renzo N. Rocchegiani
(74) Attorney, Agent, or Firm—Lerner, David, Littenberg, Krumholz & Mentlik, LLP

(57) ABSTRACT

Microelectronic assemblies are encapsulated using disposable frames. The microelectronic assemblies are disposed within an aperture defined by a frame. The aperture is covered by top and bottom sealing layers so that the frame and sealing layers define an enclosed space encompassing the assemblies. The encapsulant is injected into this closed space. The frame is then separated from the encapsulation fixture and held in a curing oven. After cure, the frame is cut apart and the individual assemblies are severed from one another. Because the frame need not be held in the encapsulation fixture during curing, the process achieves a high throughput.

38 Claims, 8 Drawing Sheets

ENCAPSULATION OF MICROELECTRONIC ASSEMBLIES

BACKGROUND OF THE INVENTION

The present invention relates to encapsulation of microelectronic assemblies.

As described, for example, in U.S. Pat. No. 5,659,652; in U.S. patent application Ser. No. 08/532,235 filed Sep. 22, 1995; and in U.S. patent application Ser. No. 08/726,697, the disclosures of which are hereby incorporated by reference herein, microelectronic assemblies can be made with microelectronic elements such as a semiconductor chip having contact thereon and a flexible, sheet-like dielectric element having terminals thereon electrically connected to the contacts of the chip. The flexible dielectric element forms a top surface of the assembly, whereas the surface of the chip facing away from the flexible dielectric element forms the bottom surface of the assembly. For example, where the dielectric sheet overlies the front or contact-bearing surface of the chip, the back surface of the chip forms the bottom surface of the assembly. The assembly may also include a compliant layer such as an elastomer or gel disposed between the dielectric sheet and the chip to provide mechanical decoupling of the sheet and terminals from the chip.

As disclosed in the aforementioned patents and patent applications, such compliant layers can be made by providing a porous layer such as plurality compliant pads between the chip and the sheet, electrically connecting the terminals to the contacts of the chip and then encapsulating the resulting assembly with a curable liquid encapsulant so that the encapsulant penetrates into the porous layer and also covers the connections at the contacts on the chip. Upon curing of the encapsulant to form a compliant material, the encapsulant in the porous layer forms part of the compliant layer. In making assemblies of this nature, it is desirable to avoid applying encapsulant onto the top and bottom surfaces of the assembly. That is, it is desirable to avoid applying an encapsulant on the top surface of the dielectric sheet and on the terminals or on the surface of the chip defining the back surface of the assembly. It is also desirable to ensure that the encapsulant completely fills the porous layer, to provide a substantially void-free compliant layer in the final assembly.

Several useful methods of applying and curing the encapsulant in microelectronic assemblies have been proposed in commonly assigned, copending United States patents applications and patents. For example, as set forth in the aforementioned Ser. No. 08/532,235 application, the dielectric sheets incorporated in the assemblies typically include apertures or "bond windows" which provide access to the contacts of the chip during the step of electrically connecting the terminals to the chip. After these connections have been made, a top cover layer may be applied over the top surface of the dielectric sheet. Typically, several assemblies are provided in a side by side arrangement so the same top cover layer lies on the top surfaces of several assemblies. The top cover layer seals the bond windows and also seals spaces between the dielectric sheets of adjacent assemblies. A bottom cover layer is provided over the bottom surfaces of the assemblies. The cover layers and assemblies are held in a fixture. A pocket in the fixture holds a curable liquid encapsulant. After the space between the cover layers is brought to subatmospheric pressure by connecting the fixture to a vacuum source, the fixture is tilted so as to pour the liquid encapsulant into the space between the cover layers whereupon the encapsulant is cured while the components remain in place in the fixture. The top and bottom cover layers retain the encapsulant and prevent it from contaminating the bottom surfaces of the chips or the top surfaces of the dielectric layers.

As described in the aforementioned U.S. Pat. No. 5,659, 952 and U.S. patent application Ser. No. 08/726,697 the encapsulant may be applied using a nozzle or a syringe around the periphery of each subassembly. For example, as shown in the '697 application, a plurality of assemblies can be made using a single, unitary dielectric sheet element, commonly referred to as a "tape" which incorporates the dielectric sheets of several subassemblies. The chips may be attached to the tape and electrically connected to the terminals of the tape. At this point, a needle connected to an encapsulant dispenser is used to trace a pattern around the peripheries of the individual chips, so that the encapsulant flows into the space between each chip and the dielectric layer. A covering layer may be used to close the bond windows in the tape during this process. Also, during this process, the tape typically is held in a frame. In a further variant of this process, described in U.S. patent application Ser. No. 08/975,590, the disclosure of which is also incorporated by reference herein, the frame and tape are placed in a vacuum chamber, and the encapsulant dispensing operation is conducted inside the chamber, while the assembly is under vacuum. When the vacuum is released, and the chamber is brought to atmospheric or superatmospheric pressure, the pressure forces the encapsulant into the porous layer between the chip and the tape. Further, as described in U.S. patent application Ser. No. 09/012,590, filed Jan. 23, 1998, the disclosure of which is also incorporated by reference herein, it is convenient to use a frame to hold the tape during the assembly procedures. For example, the compliant pads used to form the porous layer may be applied to the tape while the tape is mounted on the frame and the chips may be mechanically attached to the pads and electrically connected to the terminals also while the tape is mounted on the frame.

Despite all of these advances in manufacture of microelectronic assemblies, still further improvement would be desirable.

SUMMARY OF THE INVENTION

One aspect of the invention provides methods of encapsulating micro-electronic assemblies. A method according to this aspect of the invention desirably includes the steps of providing the assemblies within an opening in a frame having top and bottom surfaces and providing top and bottom sealing layers sealingly connected to the frame extending across the opening of the frame. The top and bottom sealing layers together with the frame define an enclosed space encompassing the assemblies. Thus, the top and bottom sealing layers may extend over the surfaces of the assemblies, or one or both of the sealing layers themselves may define the surfaces of the assemblies. For example, where the assemblies are formed from semiconductor chips mounted to a flexible tape, one of the sealing layers may consist of the tape or may include the tape together with a separate cover layer overlying the tape. The frame, sealing layers and assemblies are engaged in a fixture as, for example, by clamping the frame and sealing layers between top and bottom elements of the fixture. While the frame is engaged in the fixture a liquid encapsulant is injected into the enclosed space, between the sealing layers and around the assemblies. The encapsulant is then cured. After curing, the assemblies are removed from the frame and severed from one another. Typically, the frame is a disposable unit, formed from a polymeric material, a fibrous material or combination of such materials and the frame is destroyed during the step of removing the assemblies from the frame. For example, the frame may be cut apart in the same operation used to sever the various assemblies from one another.

Because the frame and the sealing layers cooperatively confine the liquid encapsulant, the frame and sealing layers can be removed from the fixture after the encapsulant is injected. Thus, some frames which have already been injected with encapsulant may be cured while further frames are being filled with encapsulant. This avoids the need to occupy the encapsulation fixture for the extended period of time required to cure the encapsulant. Typically, this enclosed space is evacuated before the encapsulant is introduced. This allows filling of the encapsulant without formation of voids. For example, one of the sealing layers may incorporate a hole and a vacuum may be applied through such hole while the frame is in the encapsulation fixture. After the vacuum has been applied, a needle may be advanced into the hole and encapsulant may be injected through the needle. The needle is then withdrawn and the frame is removed from the encapsulation fixture.

As further discussed below, where one of the sealing layers incorporates a tape having electrically conductive components thereon, the step of providing the microelectronic assemblies frames and sealing layers may include the step of attaching several semiconductor chips to the tape while the tape is held in the frame. That is, the same frame used in the assembly procedure is also used in the encapsulation procedure, thus further simplifying handling. The sealing layers may be wholly or partially removable or else may include features which are intended to form part of the finished microelectronic assemblies. For example, the sealing layers may include thermally conductive structures which form heat spreaders in the finished micro-electronic assemblies; packaging elements which form protective structures in the finished assemblies; or both. Also, where the microelectronic assemblies incorporate optically active elements such as a photoemitter or photoreceiver, the sealing layers may incorporate light transmitting elements which act as a light window in the finished assembly. Such transparent elements may be refractive elements such as lenses.

An encapsulation fixture according to a further aspect of the invention may include a top fixture element defining a top element face and a passage open to the top element face, with a vacuum connection communicating with the passage. The fixture may also include a hollow needle having a distal tip slidably mounted in the passage for movement between a retracted position in which the distal tip is within the passage and an advanced position wherein the distal tip protrudes beyond the face. Further, the fixture may include an encapsulant dispenser connected to the hollow needle, a bottom fixture element defining a bottom face facing toward the top element face and a clamp engagable with the fixture elements for urging the fixture elements together. Such a fixture may be used in the aforementioned methods. The encapsulation fixture may include a bottom fixture having a central region and a peripheral region surrounding the central region. The peripheral region defines the bottom element face whereas a recess is provided in the central region. A floating plate is mounted in the recess of the bottom fixture. A clamp is arranged to urge the fixture elements towards one another so as to clamp a frame and sealing layers therebetween. The fixture is also provided with means for biasing the floating plate of the bottom fixture element upwardly, toward the top fixture element. As described further below, the floating plate maintains pressure on the microelectronic assemblies and helps to maintain the desired planar configuration of the sealing layers during encapsulant injection.

Yet a further aspect of the invention provides an encapsulation fixture including a plurality of frames as discussed below and a fixture, such as those discussed above, arranged to engage the frames in series, one after the other. The fixture has an encapsulant dispenser arranged to inject an encapsulant into the aperture of each frame while the frame is engaged between the elements of the fixture. The encapsulation system desirably includes a curing station such as a curing oven for holding frames after injection of the encapsulant. Yet a further aspect of the invention provides a semi-finished article including a frame as aforesaid having top and bottom surfaces and an aperture extending therethrough, top and bottom sealing layers sealingly connected to the frame and defining an enclosed space together with a plurality of microelectronic assemblies disposed in the enclosed space. The article may further include a cured or uncured encapsulant. Such a semi-finished article may be used in the processes as discussed above.

DETAILED DESCRIPTION OF THE PREFERRED EMBODIMENTS

Figure 1:
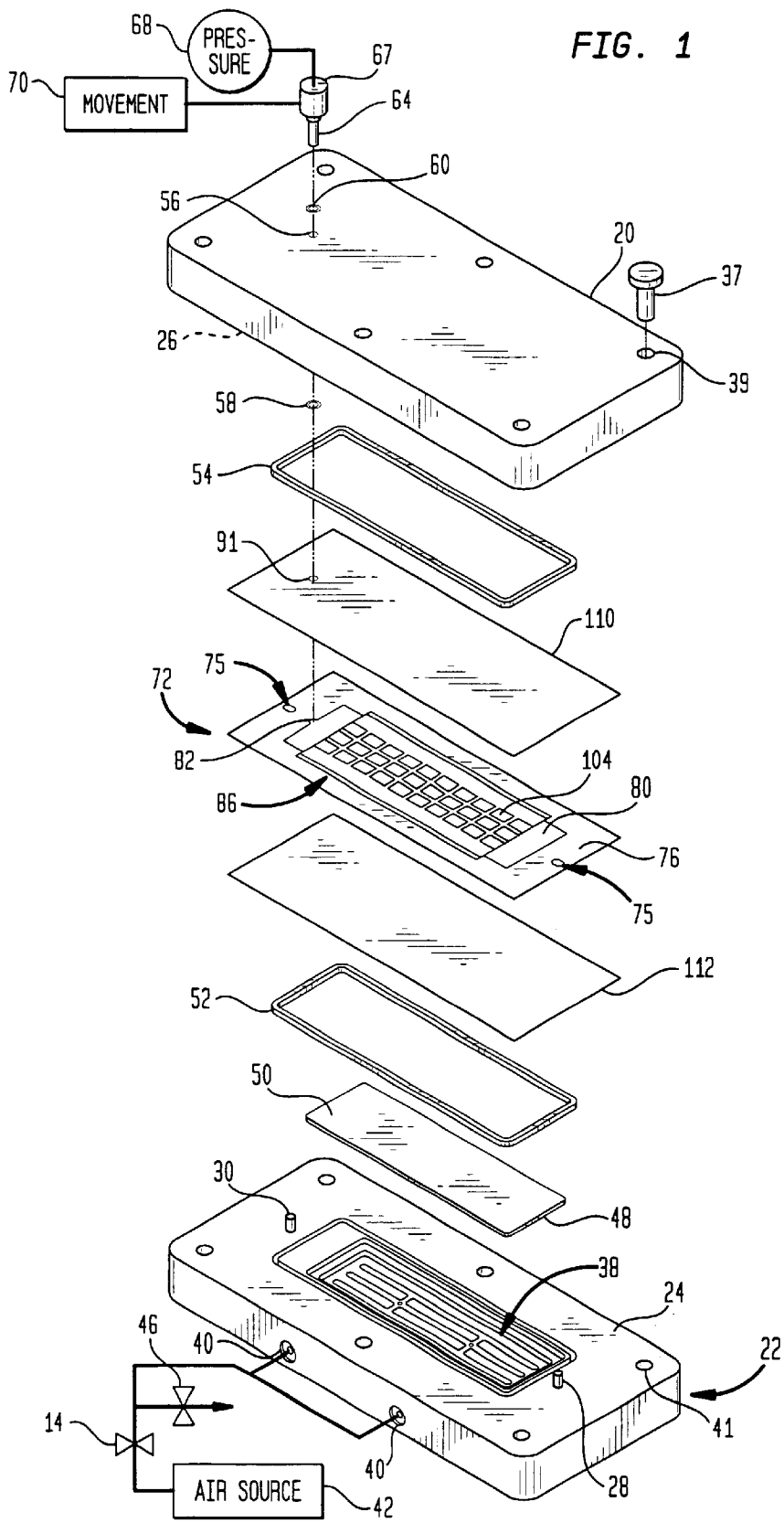
FIG. 1 is an exploded view of an injection fixture and components in accordance with one embodiment of the invention.
Figure 2:
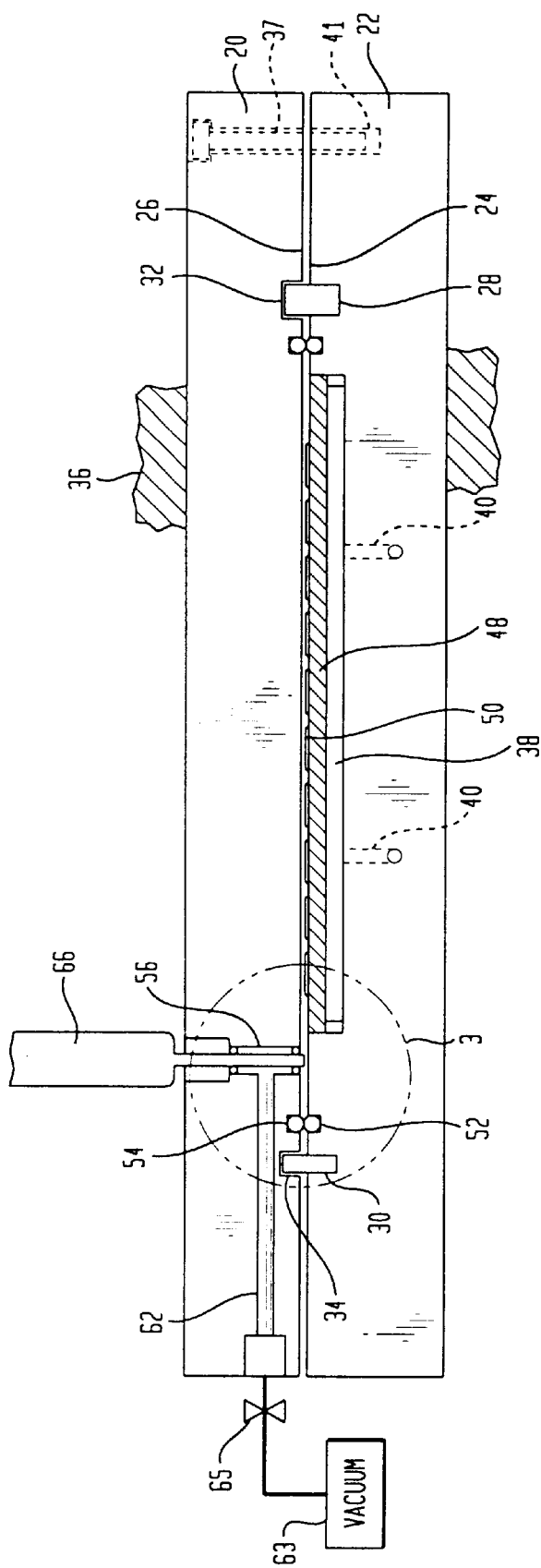
FIG. 2 is a sectional view depicting the components and fixture shown in FIG. 1.

A fixture in accordance with one embodiment of the invention includes a top fixture element 20 and a bottom fixture element 22. The bottom fixture element has a bottom element face 24 facing upwardly, whereas the top fixture element has a top element face 26 facing downwardly. The bottom fixture element has a pair of alignment pins 28 and 30 projecting upwardly from bottom element face 24. The top fixture element has alignment holes 32 and 34 (FIG. 2). The pins are engageable in the alignment holes to hold the fixture elements at a preselected alignment in horizontal directions, but allow the fixture elements to move relative to one another in vertical directions, towards and away from one another. A clamp 36, schematically indicated in FIG. 2 is arranged to engage both fixture elements and urge the fixture elements towards one another. Clamp 36 may be any conventional type of clamp as, for example, a mechanically or hydraulically actuated press such as an arbor press or a screw press. Alternatively, clamp 36 may include screws 37 extending through holes 39 in the top fixture and threadedly engaged in holes 41 in the bottom fixture element 22. Although only one screw 37 is illustrated in FIGS. 1 and 2, in practice plural screws and screw holes would be distributed around the periphery of the fixture elements.

Bottom fixture element 22 has a recess or chamber 38 open to surface 24 and extending downwardly from such surface into the bottom fixture element. Passages 40 extend from recess 38 to a side of the bottom fixture. Passages 40 are provided with standard threads, such as pipe threads, for connection to a source of compressed air 42 through an air inlet valve 44. A bleed valve 46 is also connected between passages 40 and the atmosphere. A floating plate 48, also referred to a die support plate is closely fitted with recess 38. The die support plate or floating plate 48 has an upper surface 50. Air admitted through passages 40 from source 42 can bias plate 48 upwardly. Alternative biasing devices may also be employed. For example, springs may be fitted between the bottom of the die support plate and the bottom fixture. Any other device capable of urging the die support plate upwardly may also be employed as, for example, electromagnetic biasing devices or even gravitationally actuated biasing devices. A bottom gasket in the form of a generally rectangular O-ring 52 is seated in a groove in bottom element surface 24.

Top fixture element 20 has a similar top gasket 54 seated in a groove in the downwardly facing top element surface 26. A needle passage 56 extends vertically through the top fixture element 20 and has a distal end open to top fixture element surface 26. A distal O-ring 58 surrounds passage 56 at the distal end of the passage. O-ring 58 is formed from a resilient material such as a rubber and projects slightly beyond the top fixture element surface 26 when the O-ring is in an uncompressed condition. A generally similar proximal O-ring 60 surrounds passage 56 at a location remote from the top element surface 26 and hence remote from the distal end of the passage. A vacuum port 62 intersects and communicates with passage 56 at a location between the proximal and distal O-rings. A vacuum source 63 is connected to vacuum port 62. Source 63 may be a plant vacuum line or dedicated vacuum pump and receiver of conventional type. Source 63 may be connected to port 62 through a control valve 65. The control valve may be arranged to connect the port selectively either to the vacuum source or to the atmosphere, so that vacuum may be applied and relieved selectively.

Figure 3:
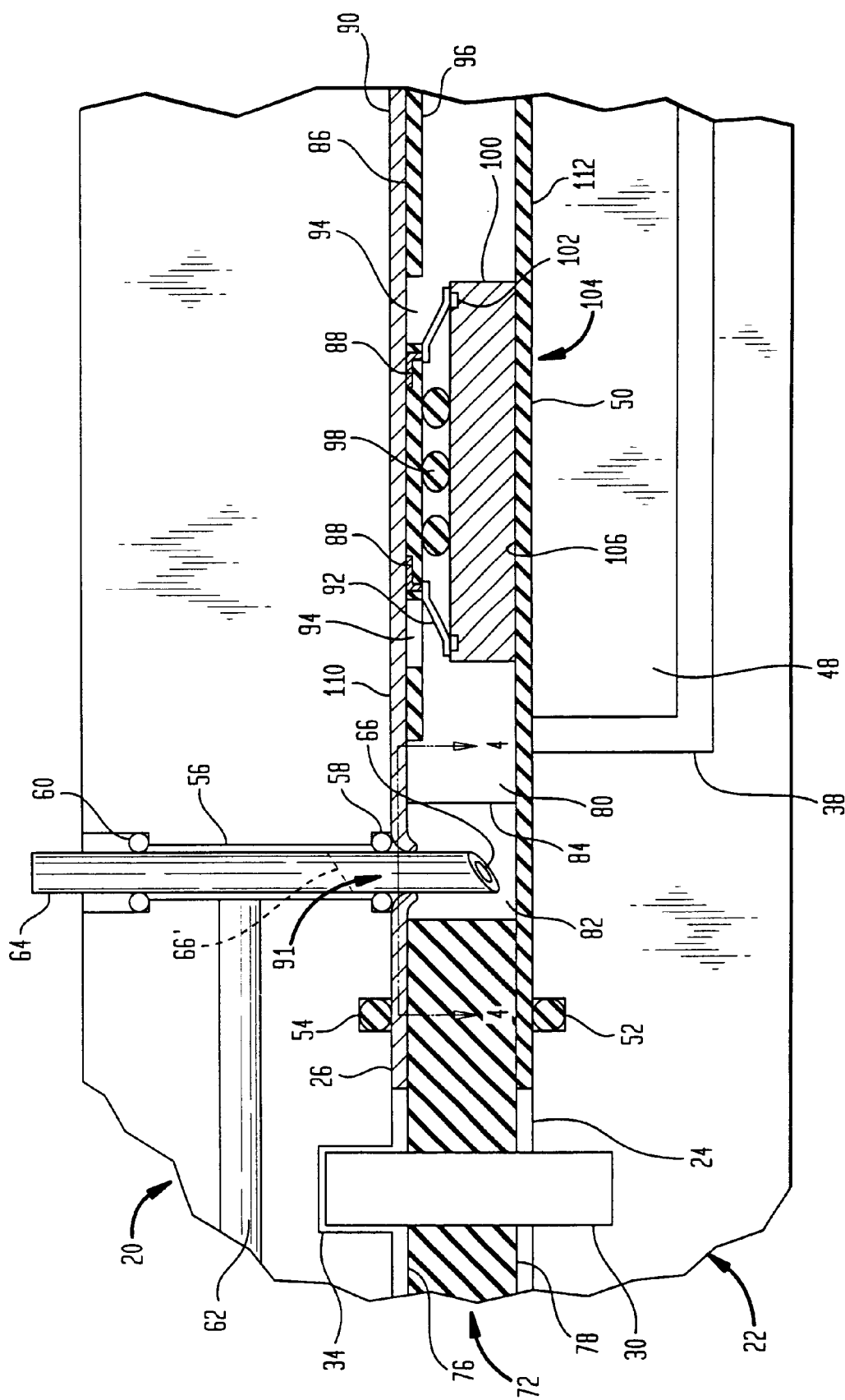
FIG. 3 is a fragmentary view, taken on an enlarged scale, depicting a portion of the components and fixtures shown in FIG. 2.

A hollow needle 64 having a distal end 66 is slidably engaged with O-rings 58 and 60, so that the needle can be moved between the advanced position shown in solid lines in FIG. 3, and a retracted position at which the tip of the needle is recessed from a top fixture element surface 26 as indicated at 66' in FIG. 3. Needle 64 may be a conventional large hypodermic needle such as a 10 gauge to 18 gauge needle. The needle is connected to an encapsulant dispenser 67. The dispenser incorporates a chamber connected to the needle and a controllable pressure source 68 for applying pressure to the encapsulant for releasing such pressure. A movement device 70 is linked to the dispenser 67 and hence to needle 64. The movement device may include an electrical, pneumatic, mechanical or other power-driven linkage arranged to slide the needle upwardly and downwardly relative to the fixture. Alternatively, the movement device may be a hand grip mounted on the dispenser or needle or formed integrally therewith so that an operator can move the dispenser and needle between the retracted and advanced positions depicted in FIG. 3.

Figure 4:
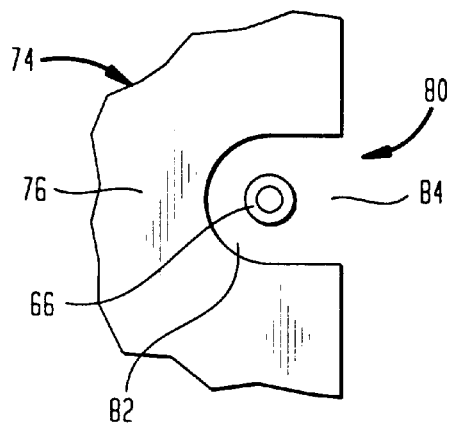
FIG. 4 is a fragmentary sectional view taken along line 4—4 in FIG. 3.
Figure 5:
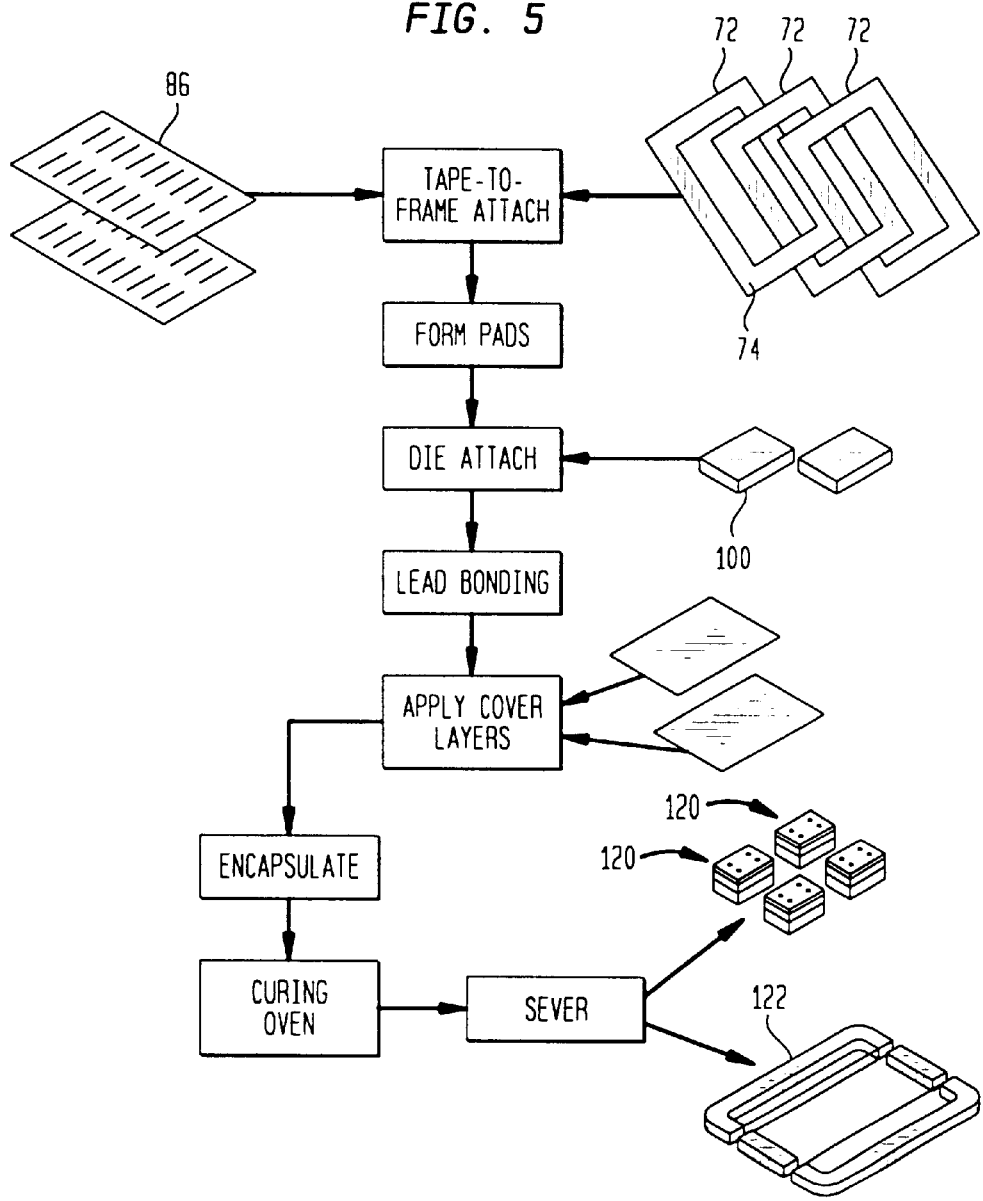
FIG. 5 is a block diagram of a process in accordance with one embodiment of the invention, using the components and fixtures shown in FIGS. 1–3.

The system also includes a large number of disposable frames 72. Although only one such frame is shown in each of FIGS. 1–3, it should be appreciated that a large number of such frames are actually employed. As further discussed below in connection with the process, each batch of microelectronic assemblies is processed through the system in one frame and that frame is destroyed at the end of the processing operations. The frames are processed in series through the various processing operations. Each frame 72 includes a structure defining a top surface 76, a bottom surface 78 (FIG. 3) and a generally rectangular aperture 80 extending through the structure, between the top and bottom surfaces. Each frame also has alignment holes 75 extending through it at positions corresponding to the positions of alignment pins 28 and 30 of the bottom fixture element. The structure of each frame 72 also defines a needle alignment hole 82 extending into the top surface of structure 74 adjacent one end of aperture 80. The needle alignment hole communicates with aperture 80 through a gate channel 84. As best seen in FIGS. 3 and 4, the needle alignment hole is a circular bore extending into the structure from the top surface. The gate channel has a width equal to the diameter of the needle alignment hole, so that the needle alignment hole and gate channel cooperatively form a U-shaped opening. For example, the needle alignment hole or bore 82 may be about 0.100 inches (0.254 mm) in diameter. The frames desirably are formed from relatively rigid but inexpensive material such as paper-phenolic composites. Other polymeric and fibrous materials may also be employed as, for example, fiber reinforced epoxy. Desirably, the frame has a relatively low mass and also a relatively low specific heat, and can be heated readily. The frames desirably are formed by a mass production processes such as stamping, die-cutting or injection molding at a low cost.

In a process according to one embodiment of the invention, a large number of disposable frames 72 as discussed above, are assembled with dielectric sheets, also referred to as "tapes" 86. Each tape has numerous bond sites arranged in rectilinear rows. At each bond site, the tape has a set of electrically conductive metallic terminals 88 exposed at a top surface 90 of the tape. Thus, the terminals 88 may be disposed on the top surface or else may be recessed within the tape or even disposed on the bottom surface of the tape, provided that holes (not shown) are provided so that the terminal is exposed at the top surface. Each tape also has a large number of electrically conductive flexible metallic leads 92 connected to terminals 88 and a set of bond windows 94 extending through the tape, between the top surface 90 and the bottom surface 96 of the tape. The tape may also include additional conductive features such as metallic traces extending along surfaces of the tape or in one or more layers within the tape interconnecting terminals and/or leads, as well as ground or power planes. As described in commonly assigned U.S. Pat. Nos. 5,679,977; 5,518,964; and copending, commonly assigned U.S. patent applications Ser. No. 08/365,749, the disclosures of which are also incorporated by reference herein, the bond site may have widely varying configurations. For example, the particular bond site illustrated in FIG. 3 is a "fan-in" arrangement having its terminals disposed on a central portion of the tape and having the leads 92 projecting outwardly from such central portion. So called "fan-out" structures in which the leads project inwardly from the terminals and combinations of these approaches may also be employed. Preferably, when the tape is fabricated, each lead has a first end permanently connected to the tape and a second end, on the opposite side of the bond window releasably connected to the tape.

Each tape 86 is attached to a frame 72 in any convenient manner as, for example, by attaching the tape to the frame with adhesive tapes (not shown). Extreme precision is not required in this positioning the tape on the frame. The edges of each tape 86 overlap portions of the frame 72. In the next stage of the process, compliant pads such as elastomeric pads 98 are applied on the bottom surface 96 of the tape at each bond site, as by stencil printing a curable elastomer composition and partially or fully curing the composition. These pads 98 form a porous structure or layer at each bond site with channels between the pads providing porosity. In the die attach step, semiconductor chips 100 are attached onto the elastomeric pads 98 at each bond site. The chips are bonded with their front surfaces having contacts 102 thereon facing toward the tape and with their rear surfaces 106 facing away from the tape.

The leads 92 at each bond site are then bonded to the contacts 102 of the chip at that bond site. The bonding operation may include conventional TAB bonding or the use of a conventional wire bond to form portions of the leads extending to the contacts. Preferably however, the bonding operation is performed as described in the aforementioned commonly assigned patents and patent publications. For example, the bonding operation may be performed by inserting a tool through the bond windows 94 so as to detach one end of each lead from the tape and bond the detached end to the contact of the chip. The resulting semi-finished product has a large number of semiconductor chip assemblies 104 arranged side-by-side. Each such assembly includes one chip 100 and a region of the tape 86. The chips are disposed within the aperture 80 of the frame 72. The back surface 106 of each chip forms the bottom surface of each chip assembly, whereas the top surface of the tape forms the top of such assembly. The top surfaces of the assemblies face upwardly at the top surface 76 of the frame, and are coplanar or nearly coplanar with the top surface of the frame. The bottom surfaces of the assemblies face downwardly and are coplanar or nearly coplanar with the bottom surface 78 of the frame.

After the leads have been bonded, a top cover layer 110 is applied over the top surface of each tape and over the top surface 76 of the tape frame 72 bearing the tape. The top cover layer thus overlies the top surfaces of all of the various assemblies. The top cover layer may be a polymeric sheet of the type commonly used as a solder mask layer. The top cover layer typically has an adhesive on it capable of bonding to the top surfaces of the tape and of the frame. The top cover layer may have holes (not shown) which are registered with the terminals 88 so as to maintain accessibility of the terminals. Alternatively, the holes may be formed in the top cover layer after application of the layer, as by a photo imaging process or by laser ablation. However, the top cover layer forms a seal over each of the bond windows 94 and also seals to the frame around the edges of the tape and around the edges of aperture 80. The top cover layer also has a needle hole 91 extending through it in registry with the needle alignment hole 82 in the frame. A similar bottom cover layer 112 is applied on the bottom surfaces of the microelectronic assemblies, i.e., on the back surfaces 106 of chips 100 and is also applied on the bottom surface 78 of the tape frame structure associated with such assemblies. The bottom cover layer does not have holes. The top and bottom cover layers thus act top and bottom sealing layers. The tape also forms a part of the top sealing layer. The top and bottom sealing layers, with the frame, define an enclosed space encompassing the microelectronic assemblies.

The foregoing operations are performed on numerous frames 72 and the associated tapes, in series, so that the frames are processed one after the other. Thus, a series of frames 72, each carrying a set of microelectronic assemblies and cover layers as discussed above is presented to the encapsulation fixture. The encapsulation fixture operates cyclically. In each cycle of operation, one frame, with the associated assemblies, tape and cover layers, is presented to the encapsulation fixture and processed by the encapsulation fixture. Each such frame is placed into the encapsulation fixture while the top and bottom fixture elements 20 and 22 are separated from one another. The alignment holes 75 in the frame are aligned with the pins 28 and 30 of the bottom fixture element and the frame is placed onto the bottom fixture elements so that the bottom surface 78 of the frame faces towards the bottom fixture element. The bottom cover layer 112 is thus engaged with the bottom element 24 and gasket 52 of the bottom fixture element. The top fixture element is then placed over the frame and advanced downwardly on the locating pins 30 and 28 so that the top element surface 26 and top element gasket 54 engage the top cover layer 110. The clamp 36 (FIG. 2) is actuated to force the fixture elements towards one another. This forcibly engages the gaskets 52 and 54 with the cover layers and squeezes the frame and cover layers between the fixture elements. This helps to maintain the sealing engagement of the cover layers with the frame. As the top fixture element is moved downwardly towards the bottom fixture element, the distal O-ring 58 around passage 56 sealingly engages the top cover layer 110. The needle alignment hole 82 is aligned with passage 56. However, because the needle alignment hole 82 is of relatively small diameter, the frame still supports the top cover layer in the region engaged by proximal O-ring 58. Air source 42 and valves 44 and 46 are actuated to direct compressed air into recess 38 and thereby urge the floating plate or bottom die support plate 48 upwardly, against the bottom cover layer. The floating plate thus urges the chips 100 upwardly and places the complaint pads 98 in compression, thereby assuring that the tape 86, terminals 88 and cover layer 100 will lie against top element surface 26 in a substantially planar configuration.

While the fixtures are being engaged with one another, needle 64 is held in the retracted position, with the tip at 66'

(FIG. 3). After the fixtures are engaged and the cover layers and frame are in compression between the fixtures and gaskets, a vacuum is applied to port 62 by vacuum apparatus 63 and valve 65. At this time, the port is in communication with passage 56 and is in communication with the space between the cover layers through hole 91 in the top cover layer. Air is thus evacuated from the space between the cover layers through the hole formed by the needle. This action removes air from the porous layers, i.e., from the spaces between the individual compliant pads 98 of the semiconductor chip assemblies. In a variant of the process, the top cover layer may be provided without hole 91. Prior to the evacuation step, the needle is advanced to the advanced position. Point 66 pierces the top cover layer inside distal O-ring 58 to form hole 91 place, whereupon the needle is retracted and the vacuum is applied as discussed above.

After the space has been evacuated, the needle is again brought to the advanced position so as to position the tip 66 of the needle as depicted in solid lines in FIG. 3. The diameter of hole 91 is slightly smaller than the outside diameter of the needle, so that the needle has an interference fit with the cover layer at hole 91. The dispenser 67 (FIG. 1) is actuated to force a liquid encapsulant through the needle and out of the distal end 66 of the needle. The flowing encapsulant passes through the needle alignment hole and through gate channel 84 into the space between the cover layers, within the aperture 80 of the frame. The encapsulant fills the spaces between the microelectronic elements and also fills the spaces within the porous layer of each assembly. Although a wide variety of encapsulants may be employed, the encapsulant desirably is a liquid composition arranged to cure into a dielectric elastomer or gel. Silicon compositions are particularly preferred. Among the preferred silicon encapsulants are those sold under the designations DC-577; DC-6820 and DC-7010 by the Dow Corning Company of Midland, Mich. Preferred compositions include curing agents which can be activated by exposure to heat. In the uncured condition, the compositions desirably have some degree of thixotropy. That is, the compositions desirably have non-Newtonian, time-dependent flow characteristics such that once the compositions are allowed to remain undisturbed for a brief period. Substantial stress must be applied to the compositions to make them flow again. Thixotropic properties can be imparted by adding finely divided solid fillers such as silica to the gel composition. The use of thixotropic encapsulants is described in U.S. patent application Ser. No. 60/062,471 filed Oct. 15, 1997, the disclosure of which is incorporated by reference herein. Typically, the pressure of about 100 pounds per square inch (689 KPa) or more, and typically about 150 pounds per square inch (1034 KPa) is applied to the encapsulant by the dispenser 66. This pressure forces it through the needle and applies sufficient shear stress to the material to break the thixotropic "set." Thus, while the material is being applied, it flows freely into the space between the cover layers and flows freely into and around each of the microelectronic assemblies. The pressure applied by the dispenser is then released and the needle withdrawn to the retracted position 66'.

At this point, the bias applied to floating plate 48 is released, the fixture elements are unclamped and separated from one another and the frame is removed from the fixture. When the frame is removed from the encapsulation fixture, the cover layers and frame confine the encapsulant. The hole formed by the needle theoretically offers some path for leakage of the encapsulant. However, the thixotropic properties of the encapsulant cause it to set up to a sufficient degree to resist leakage out of the hole. Moreover, the cover layer tends to spring back and at least partially seal itself with time after the needle is removed. If additional assurance against encapsulant leakage is desired, the hole left by the needle can be plugged by a disposable plug, such as a nail-shaped polymeric part or else can be covered over with a piece of adhesive tape. In yet another alternative, the hole left by the needle can be subjected to an intense, local heating, as by a focused infrared lamp to cure the encapsulant at the hole and seal the hole temporarily before the remainder of the encapsulant is cured. Additional frames are processed through the foregoing steps, including the encapsulation fixture, while the previously-encapsulated frames are being cured.

Promptly after removal from the encapsulation fixture, each frame is transferred into a curing oven, where it is heated to a temperature sufficient to cure the encapsulant, typically about 80–150° C., and held in the curing oven for a time sufficient to cure the encapsulant. Typically, each frame must remain in the curing oven for about 30 minutes–120 minutes. However, because each frame is removed from the encapsulation fixture and cured separately from the encapsulation fixture, the encapsulation fixture can be used to encapsulate subsequent frames while the previously encapsulated frames are being cured. Moreover, the frames have a relatively low thermal mass. Therefore, the frame without the encapsulation fixture, will have to equilibrium temperature in the curing oven far more rapidly than one could heat the entire encapsulation fixture. Because the encapsulant is confined within the cover layers and the frame, the encapsulation fixture are readily or entirely free of encapsulant. This greatly reduces the need for expensive and arduous cleaning of the encapsulation fixture.

When each frame has been held in the curing oven for a sufficient time, it is removed and transferred to a severing step. In the severing step, the frame, cover layers and tape are cut apart to leave individual units 120. Typically, each unit includes one chip and the associated region of the tape, with the terminals in such region being connected to the chip. However, depending on the nature of the chips and the interconnections made through the tape, each unit may include two or more chips of the same or different types. Each unit provides a complete packaged semiconductor chip or chips. The units can be mounted on a circuit board or other substrate, with the terminals 88 being bonded to contact pads on the substrate. The bottom cover layer may be removed to expose the back surfaces of the chip for better heat transfer. A conventional heat sink or other heat transfer device may be attached to the back surface of the chip. Alternatively, the bottom cover layer may be left in place. The top cover layer may remain in place as a solder mask layer on the top surface of the assembly. The frame and portions of the encapsulant layer are cut apart during the severing process, and yield scrap pieces 122 which are discarded.

Figure 6:
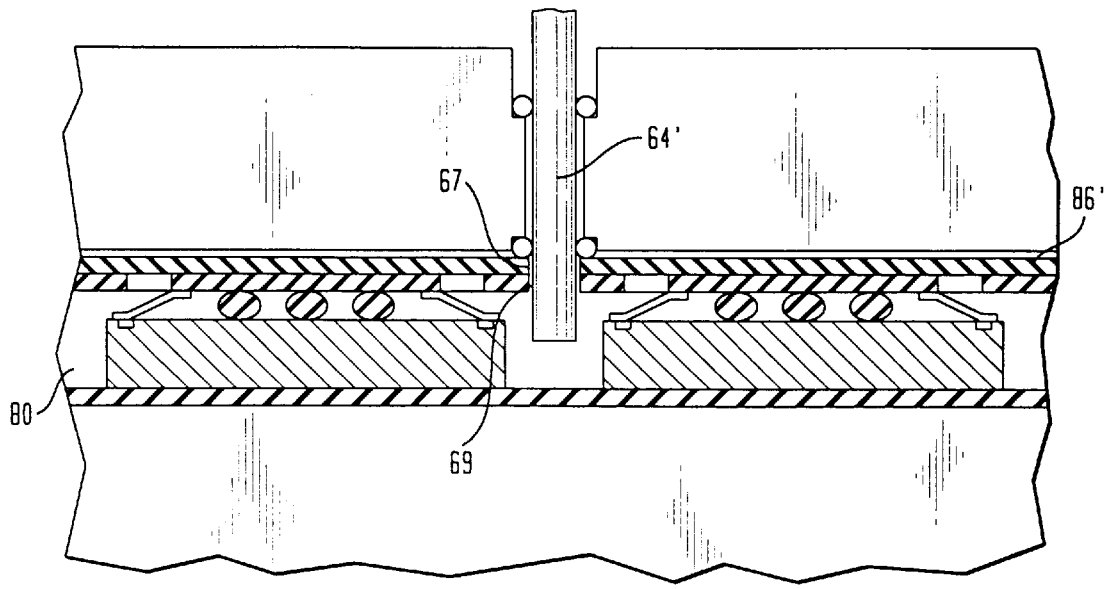
FIG. 6. is a fragmentary sectional view similar to FIG. 3 but depicting portions of a process in accordance with another embodiment of the invention.

Numerous variations and combinations of the features discussed above can be utilized without departing from the present invention. Merely by way of example, each frame 72 may be provided with one or more bores or holes extending through the structure of the frame itself, between an edge of the frame and the aperture 80 of the frame. The vacuum may be applied through such holes and the encapsulant may be injected into the aperture through such holes. Alternatively, needle alignment hole 82 and gate channel 84 may be omitted. As shown in FIG. 6, the needle 64' may be arranged to enter into the space between the cover layers through a hole 57 in the cover layer and an aligned hole 69 in the tape 86' at a location within the aperture 80 of the frame, between two adjacent microelectronic assemblies. Holes 67 and 69 may be preformed in the tape end cover layer, in which case a blunt needle 64 may be used. A similar blunt needle may be used in the embodiment of FIGS. 1–5 when the cover layer is provided with a preformed hole.

Figure 7:
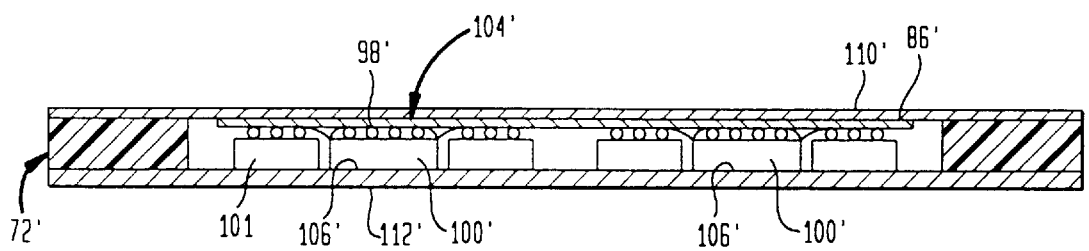
FIG. 7 is a diagrammatic sectional view depicting components in a process according to a further embodiment of the invention.

As shown in FIG. 7, the bottom sealing layer may include a thermally conductive sheet or plate such as a metallic plate 112' which will remain with the microelectronic assembly 104' after the severing step. The bottom surfaces of the assemblies, i.e., the back surfaces 106' of chips 100', desirably are bonded to the thermally conductive sealing layer 112' using a thermally conductive die attach adhesive as, for example, a silicone-silica composition or a metal-filled epoxy (not shown). The adhesive may be applied either on the sealing layer or on the surfaces of the chips before application of the cover layer. Also, each assembly 104' includes a ring 101 or support structure surrounding the chip 100'. The compliant pads or porous layer 98' are provided between the chip and the dielectric layer or tape 86' and are also provided between the rings and the tape. Thus, the compliant layer formed by the encapsulant between the chip and dielectric layer also extends between the ring and the dielectric layer. After encapsulation, the severing step is conducted so as to leave each chip with the associated ring and with that portion of the tape overlying the chip and the ring. This larger portion of the tape provides room for additional terminals as in a fan-out structure or a fan-in/fan-out structure. The ring may be formed a relatively rigid material such as silicon or molybdenum or a rigid polymer and may be electrically inert. Alternatively, the ring may incorporate one or more electrical components such as capacitors, resistors or additional semiconductor elements.

Figure 8:
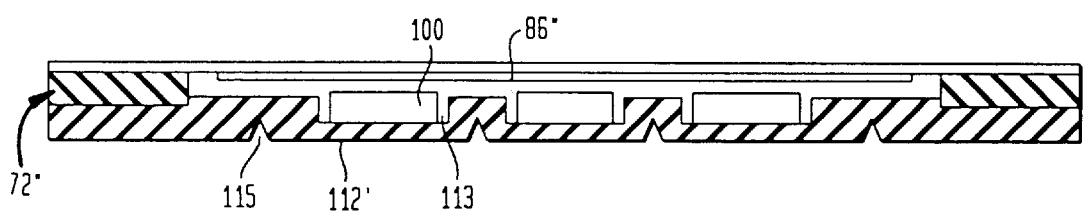
FIG. 8 is a diagrammatic sectional view depicting components in a process according to yet another embodiment of the invention.

As seen in FIG. 8, the bottom sealing layer may be a relatively thick layer 112" incorporating pockets 113 for receiving the individual chips. The bottom sealing layer may also include grooves 115 extending between the regions which will be associated with each microelectronic package. The bottom sealing layer in this case may be severed along the grooves. After severance, the remaining portions of the bottom sealing layer extend alongside the edges of the chip, towards the tape and surround the chip so as to act as part of a protective package. Such a bottom sealing layer may be formed from a dielectric polymer. Alternatively, the bottom sealing layer of this configuration may be formed from a metallic material, such material having very high thermal conductivity, so that the remaining portions of the sealing layer act as a metallic "can", i.e., as both a package and a thermal spreader.

In a further variant, the bottom sealing layer may be formed integrally with the frame. Thus, the bottom cover layer may be used to hold the chips in position during the die attach step. The bottom sealing layer may be applied to the bottom surfaces of the microelectronic assemblies during the formation of these assemblies before completion of the assemblies. Similarly, where the assemblies do not require access from the top surface during fabrication, a top cover layer or another form of sealing layer can be applied over the tape or other element defining the top surfaces of the individual assemblies at an early stage during fabrication.

In a process according to the further embodiment of the invention, the bottom sealing layer 212 (FIG. 9) is formed integrally with frame 272. Also, tape 286 is substantially inperfurate except for hole 291 used for injection and encapsulation. Thus, the tape 286 itself constitutes the entire top sealing layer. In the particular arrangement illustrated in FIG. 9, the terminals 288 formed on the top surface of tape 286 electrically connected to metallic structures (not shown) extending through the tape to the bottom surface of the tape (the surface facing downwardly in FIG. 9). These structures in turn are connected to contacts on chips 280 by metallic conductive elements such as solder balls 282. The solder balls may be conventional solder masses such as masses made entirely of lead-tin solder; solid-core solder balls including a coating of a solder on a core or a low-melting alloy of the type described in commonly assigned international publication WO97/40958, the disclosure of which is hereby incorporated by reference herein. The chips may be bonded to the tape while the tape is engaged with a fixture (not shown) and the combined bottom sealing layer 212 and frame 272 may be applied to the tape after the chips have been mounted.

Figure 9:
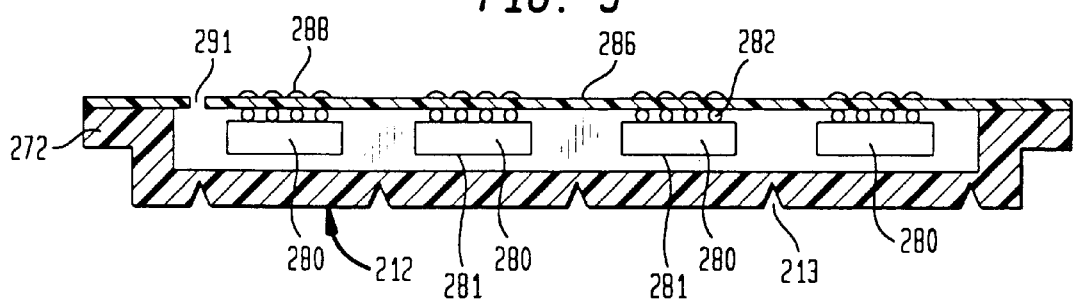
FIG. 9 is diagrammatic sectional view depicting components in a process according to still another embodiment of the invention.

The bottom sealing layer 212 extends over the back surfaces 281 of chips 280 (the surfaces facing away from tape 286), but the sealing layer is spaced apart from the back surfaces of the chips. Therefore, when the encapsulant is injected, the encapsulant flows between the back surfaces and the sealing layer. After the encapsulant is injected into the enclosed space defined by the tape or top sealing layer 286, the frame 272 and the bottom sealing layer 212, the assemblage is transferred to the curing station and cured in the manner discussed above. The assembly is then severed, as by sawing along grooves 213 in the bottom sealing layer. The arrangement wherein the bottom sealing layer is spaced from the back surfaces of the chips may be used with a relatively thick, polymeric bottom sealing layer 212 as depicted in FIG. 9 or with the relatively thin bottom sealing layer depicted in FIGS. 1–5. This arrangement can be used where it is desirable to provide additional protection in the form of encapsulant overlying the back surface of the chip.

Figure 10:
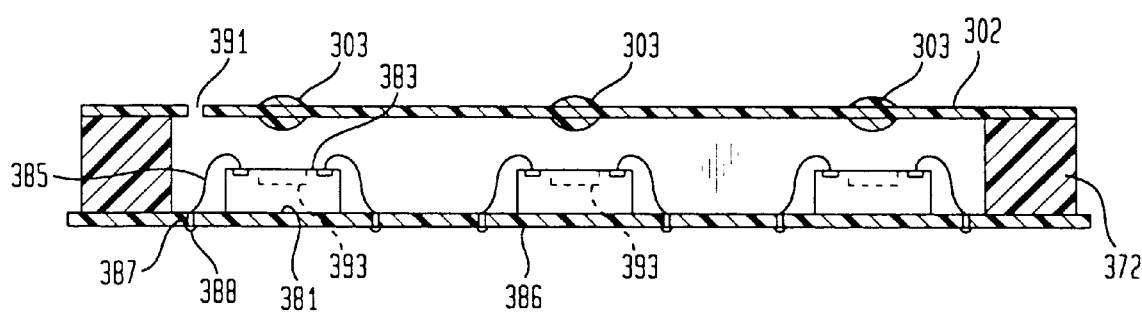
FIG. 10 is a further diagrammatic sectional view depicting components in accordance with yet another embodiment of the invention.

As seen in FIG. 10, the orientation of the chips and tape is reversed, so that the back surface 381 of each chip is connected to a surface of the tape 386. The front or contact-bearing surface 383 of each chip faces away from the tape. The contacts on the chip are connected to terminals 388 on the tape by metallic leads such as wire bonds 385 extending to metal vias 387, which in turn extend through the tape to the terminals 388. In this arrangement, the tape 386 is sealingly connected to frame 372, so that the tape forms the entire bottom sealing layer. In the embodiments discussed above, the bottom sealing layer is depicted as facing downwardly in the drawings. However, the designations "top" and "bottom" are used for convenience, to designate opposite locations and directions. A particular orientation with respect to the normal gravitational frame of reference is not essential. Thus, in the normal, gravitational frame of reference the bottom sealing layer may be at the top or facing sideways rather than at the bottom. The top sealing layer 302 extends over the front surfaces 383 of the chips, but is spaced therefrom. During encapsulation, encapsulant injected into hole 391 covers the front surfaces of the chips and also surrounds wire bonds 385.

The particular chips illustrated in FIG. 10 have optically active elements 393 at their front surfaces. As used in this disclosure, the term "optically active element" refers to a portion of a chip which can interconvert between light and electrical signals as, for example, a photodetector adapted to produce electrical signals in response to light or a photo-emitting element such as a LED or laser adapted to emitted light in response to electrical signals. The optically active elements of the chips are arranged to detect or emit light within a particular band of wavelengths. The top sealing layer 302 is arranged to transmit light within this band of wavelengths. For example, where the optically active elements of the chip are arranged to operate in the visible wavelength band, the top sealing layer may be a polymer transparent to or translucent to visible light. The particular top sealing layer illustrated is transparent to light in the band of the optically active elements and includes refractive elements 303 in the form of lenses integrally formed in the top sealing layer. The top sealing layer is mounted on the frame so that the refractive elements or lenses are aligned with the optically active elements of the chips. This assemblage of parts can be processed by encapsulation, curing and severance in the same manner as the assemblage as discussed above. However, the encapsulant used should be adapted to transmit light in the aforesaid wave length band. The lenses or refractive elements remain with the chips after the assembly is severed to separate the chips from one another.

Figure 11:
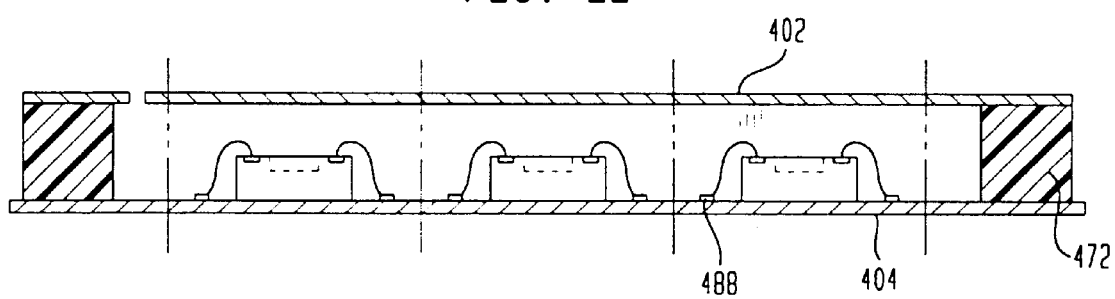
FIG. 11 is a further diagrammatic sectional view depicting components in accordance with another embodiment of the invention.
Figure 12:
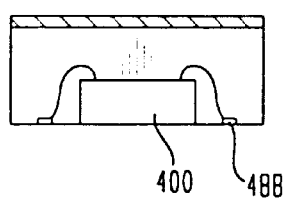
FIG. 12 is a diagrammatic sectional view depicting a finished assembly made from the components of FIG. 11.

As shown in FIG. 11, a top sealing layer 402 may be a metallic or other thermally conductive layer. Also, the bottom sealing layer 404 may be a sacrificial layer with the type disclosed in co-pending, commonly assigned U.S. patent application Ser. No. 08/634,464, filed Apr. 18, 1996, the disclosure of which is hereby incorporated by reference herein. Terminals 488 are formed on the top or inwardly facing surface of layer 404, i.e., on the surface of the layer facing into the opening of the frame. These terminals are connected to the chip, as by wire-bonding or other processes utilizing flexible leads. After encapsulation and curing, the bottom sealing layer 404 is removed as taught in the aforementioned Ser. No. 08/634,464 patent application, so as to leave terminals 488 exposed at a surface of the resulting packaged semiconductor chip unit, as shown in FIG. 12. The surface of chip 400 is also exposed in the particular arrangement of FIGS. 11–12. This procedure of providing terminals on the inwardly facing side of a sealing layer may be used with chips in other orientations, and may be used so as to provide the terminals on the top or bottom sealing layer.

Figure 13:
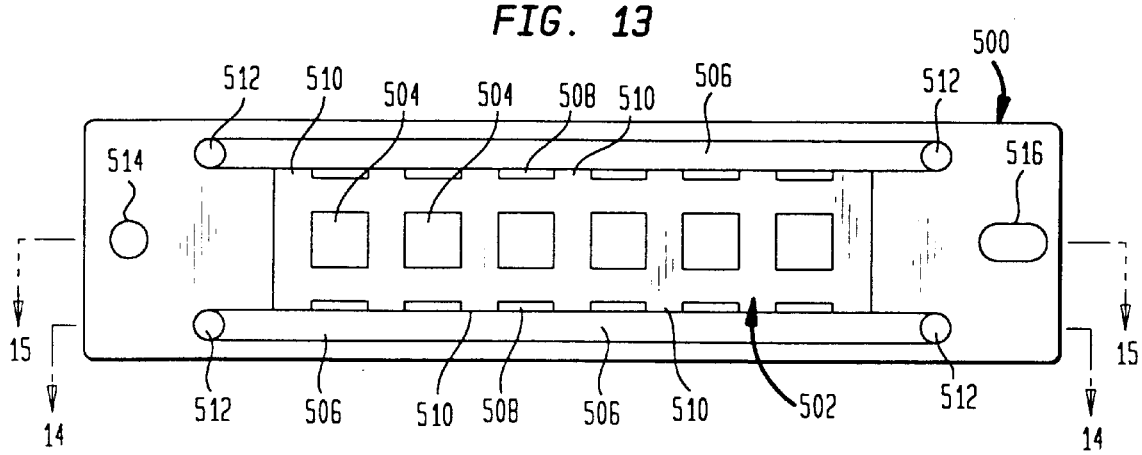
FIG. 13 is a diagrammatic plan of view of the partial frame in accordance with one embodiment of the invention.
Figure 14:
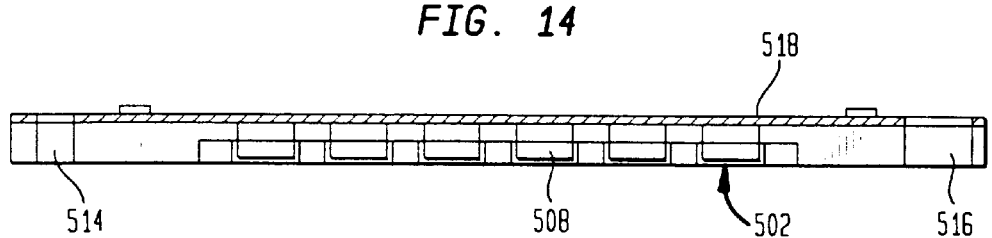
FIG. 14 is a sectional view taken along line 14—14 in FIG. 13.
Figure 15:
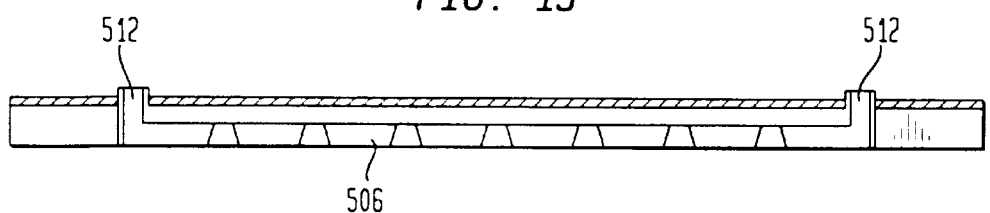
FIG. 15 is a diagrammatic sectional view taken along line 15—15 in FIG. 13.
Figure 16:
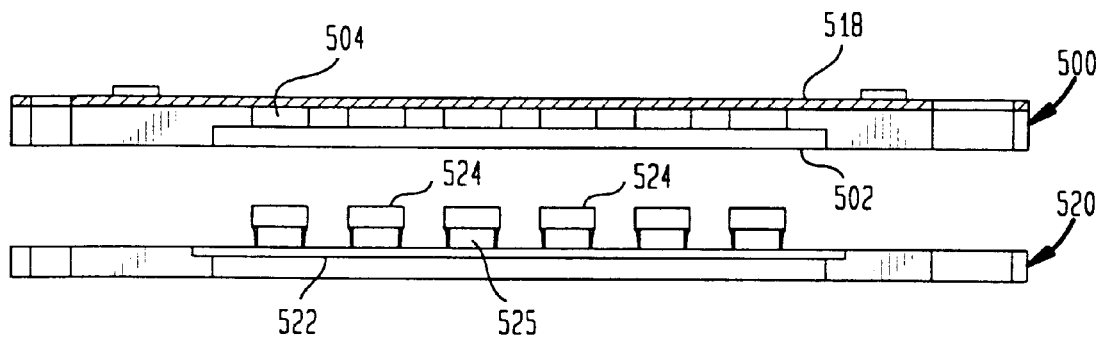
FIG. 16 is a diagrammatic sectional view depicting the partial frame of FIGS. 13–15 in conjunction with additional components.
Figure 17:
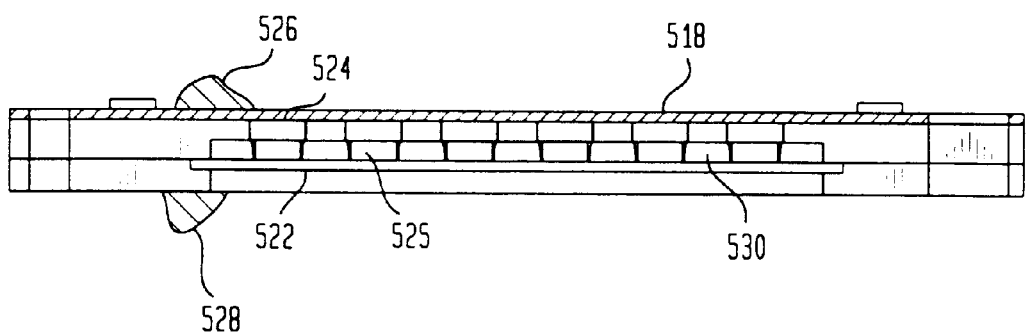
FIG. 17 is a view similar to FIG. 16 but depicting the components at a later stage in the process.
Figure 18:
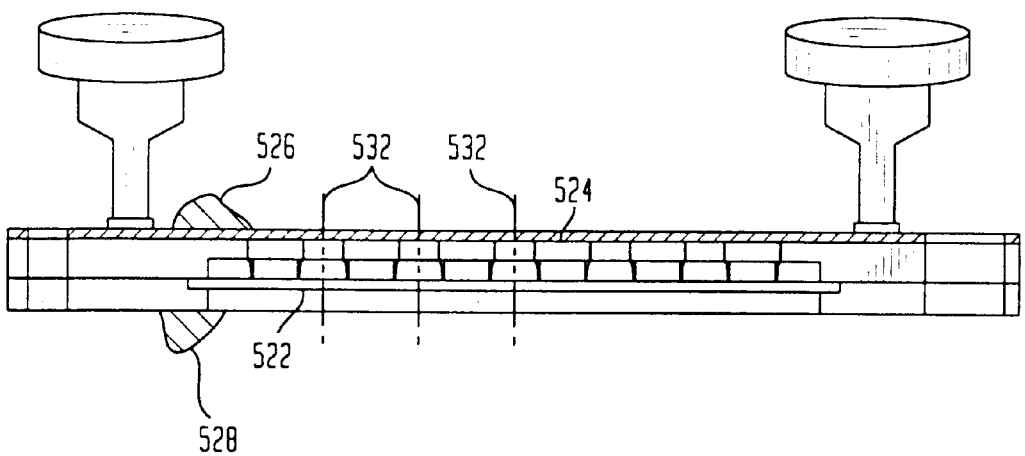
FIG. 18 is a view similar to FIG. 17 but depicting the components at still a later stage in the process.

In the embodiment of FIG. 13, the frame includes a polymeric first section 500 having a central depressed region 502 with a set of pockets 504 extending entirely through the frame in the depressed region. A pair of channels 506 extend alongside of the depressed region 502. A set of flow directors or baffles 508 project from the surface of the depressed region 502 so that there are gaps 510 between projections 510 communicating with channels 506. Holes 512 extend through frame 500 at both ends of each channel. Alignment holes 514 and 516 also extend through the frame component. A metallic sealing layer 518 is provided on the back surface of frame element 500, i.e., on the surface of the frame element opposite from depressed region 502. As best seen in FIG. 14, the metallic sealing layer overlies and closes all of apertures 504. However, the metallic sealing layer does not occlude holes 512 or alignment holes 514 and 516. An auxiliary frame element 520 (FIG. 16) is assembled with a tape 522 so that the tape is sealingly engaged with the auxiliary frame element. Porous layers 525 similar to the porous layers discussed above are provided between the chips and the tape. In the manner discussed above, semiconductor chips 524 are mounted to tape 522 and electrically connected to terminals on the tape (not shown). The frame elements are then assembled with one another so that chips 524 are lodged within openings 504 of frame element 500. The back surfaces of the chips are bonded to thermally conductive layer 518, as by a thermally conductive die attach adhesive. The frame elements are sealingly engaged with one another. Thus, the metallic sealing layer 518 and the tape or sealing layer 522 form an enclosed space which encompasses chips 524. The frame elements are engaged between fixture elements 526 and 528. While the frame elements are so engaged with one another, the enclosed space 530 is evacuated and then filled with encapsulant by injection through holes 512. As best seen in FIG. 18, the encapsulant passes along channels 506 and into the regions surrounding the various micro-electronic assemblies. The encapsulant is channeled and directed by baffles 508. The encapsulant penetrates into the porous layers 525 of the various assemblies. After encapsulation and curing, the assemblies are severed, as by cutting along lines 532 (FIG. 18) to yield a plurality of separate units. Each unit incorporates a chip 524 in contact with a portion of metallic layer 518 and incorporates a portion of frame element 500 as a ring surrounding the chip. Each unit also includes a portion of tape 522. In further variants, the injection of the encapsulant can be accomplished using some of the holes 512 whereas other holes 512 can remain connected to a vacuum system during injection. The holes which remain connected to the vacuum system may be provided with a porous plug or other structure which will pass air but will block flow of the encapsulant.

In the embodiments discussed above, the frame is disposable and is cut to pieces during severance of the individual units after encapsulation and curing. This is highly advantageous in that it avoids the need to clean the frames. Also, components of the frames may be included in the finished assemblies. However, in further variants, the frames may be formed from a durable, reusable material such as a metal. Although the frames would have to be cleaned after use, the encapsulation fixture itself would still be protected from encapsulant contamination. In this approach, the frames can be formed with relatively simple shapes which are easy to clean. Further, if the frames are formed from a material resistant to high temperatures, they may be cleaned by baking them at a high temperature sufficient to convert any clinging encapsulant to ash.

In the foregoing processes, the encapsulant enters into the individual assemblies and forms part of the complaint layer. However, the present invention can also be utilized with assemblies which are individually sealed prior to encapsulation so that the encapsulant forms an outer coating or covering on each assembly but does not enter into the assembly itself. As these and other variations and combinations of the features described above can be utilized without departing from the present invention as defined by the claims, the foregoing description of the preferred embodiment should be taken by way of illustration rather than by way of limitation of the claimed invention.

The disclosure of the copending, commonly assigned United States Patent Application of Thomas H. DiStefano et al. entitled Method of Manufacturing a Plurality of Semiconductor Packages and the Resulting Semiconductor Package Structures, filed of even date herewith, is incorporated by reference herein.

What is claimed is:

1. A method of encapsulating a plurality of microelectronic assemblies having oppositely-facing top and bottom surfaces comprising the steps of:
   (a) providing said assemblies within an opening in a frame having top and bottom surfaces, and providing top and bottom sealing layers sealingly connected to the frame extending across the opening of the frame, said top and bottom sealing layers defining an enclosed space encompassing said assemblies;
   (b) engaging the frame, sealing layers and assemblies between top and bottom fixture elements; and (c) injecting a liquid encapsulant between the sealing layers and around the assemblies while the frame, sealing layer and assemblies are engaged between the top and bottom fixture elements, said sealing layers and frame containing the liquid encapsulant; and (d) curing the liquid encapsulant.

2. A method as claimed in claim 1 further comprising the step of removing the assemblies from the frame.

3. A method as claimed in claim 2 wherein the frame is destroyed in removing the assemblies from the frame.

4. A method as claimed in claim 3 further comprising repeating the aforesaid steps using a new frame and assemblies in each repetition.

5. A method as claimed in claim 1 further comprising the step of removing said frame, sealing layers and assemblies from the fixture before said curing step, said sealing layers and frame confining said encapsulant during said injecting step.

6. A method as claimed in claim 5 wherein said curing step is performed at an elevated temperature.

7. A method as claimed in claim 6 wherein said frame is formed form a material selected from the group consisting of polymeric materials, fibrous materials and combinations thereof.

8. A method as claimed in claim 1 further comprising evacuating a space between said sealing layers and around said assemblies prior to the step of injecting said encapsulant.

9. A method as claimed in claim 8 wherein said injecting step includes the steps of advancing a hollow needle through a hole in one of said sealing layers so that said needle is in communication with said enclosed space between said sealing layers and passing the encapsulant into said enclosed space through said hollow needle.

10. A method as claimed in claim 9 wherein said evacuating step is performed by applying a vacuum through said hole.

11. A method as claimed in claim 10 wherein said step of applying a vacuum through said hole is performed by applying a vacuum to a passage in one of said fixture elements communicating with said hole while said needle is not in said hole.

12. A method as claimed in claim 11 further comprising the step of sealing said one of said fixture elements to the sealing layer having said hole by squeezing a resilient gasket surrounding said hole between the sealing layer and said one of said fixture elements.

13. A method as claimed in claim 12 wherein said frame supports the sealing layer having said hole in the vicinity of said hole.

14. A method as claimed in claim 11 wherein said step of advancing a needle is performed by advancing the needle through said passage in said one of said fixture elements.

15. A method as claimed in claim 14 wherein said sealing layer sealingly engages the needle at said hole during said step of passing the encapsulant into the space through said hollow needle.

16. A method as claimed in claim 1 wherein said assemblies have porous regions and wherein said encapsulant penetrates into said porous regions during said injecting step.

17. A method as claimed in claim 1 wherein said step of providing said assemblies, frame and sealing layer includes the step of attaching a plurality of semiconductor chips to a unitary tape and electrically connecting said chips to terminals exposed at a surface of said tape so as to provide a plurality of semiconductor chip assemblies, each including one or more of said chips and a region of the tape associated therewith.

18. A method as claimed in claim 17 wherein said step of providing said assemblies, frame and sealing layer further includes the step of providing a cover layer separate from said tape and applying said cover layer on said surface of said tape, so that said tape and said cover layer cooperatively constitute one said sealing layer.

19. A method as claimed in claim 17 wherein one said sealing layer includes said tape, and wherein said step of providing said assemblies, frame and sealing layer includes the step of sealing the tape to the frame.

20. A method as claimed in claim 17 wherein said step of attaching chips to the tape is performed so that front surfaces of said chips bearing said contacts face towards said tape, said tape forming the top surfaces of said assemblies.

21. A method as claimed in claim 20 wherein said step of providing said assemblies, frame and sealing layer includes the step of applying said bottom sealing layer on rear surfaces of said chips.

22. A method as claimed in claim 20 wherein said step of providing said assemblies, frame and sealing layer includes the step of applying said bottom sealing layer spaced from rear surfaces of said chips, so that said encapsulant will cover said rear surfaces during said step of injecting said encapsulant.

23. A method as claimed in claim 17 wherein said step of attaching chips to the tape is performed so that front surfaces of said chips bearing said contacts face away from said tape and rear surfaces of the chips face toward the tape, said tape forming the bottom surfaces of said assemblies, said top sealing layer overlying said front surfaces of said chips.

24. A method as claimed in claim 23 wherein said top sealing layer is spaced above said front surfaces of said chips so that said encapsulant flows between said front surfaces of said chips and said top sealing layer during said step of injecting said encapsulant.

25. A method as claimed in claim 23 wherein said chips include optically active elements adapted to interact with light in a band of wavelengths, and wherein said top sealing layer is transparent to light in such band of wavelengths, the method further comprising the steps of removing said assemblies from said frame so that a portion of said top sealing layer remains with each said assembly.

26. A method as claimed in claim 25 wherein said top sealing layer includes refractive elements adapted to refract light in said band of wavelengths.

27. A method as claimed in claim 23 wherein said top sealing layer is thermally conductive, the method further comprising the steps of removing said assemblies from said frame so that a portion of said top sealing layer remains with each said assembly.

28. A method as claimed in claim 17 wherein said steps of attaching said chips and electrically connecting said chips are performed while said tape is mounted on said frame.

29. A method as claimed in claim 28 further comprising the step of providing porous structures between said chips and said tape, said encapsulant filling said porous structures during said injecting step.

30. A method as claimed in claim 29 wherein said step of providing said porous structures includes the step of applying compliant pads to said tape while said tape is mounted on said frame.

31. A method as claimed in claim 28 wherein said tape has openings therein, said step of electrically connecting said chips to said terminals including performing operations through said openings, said top sealing layer sealing said openings.

32. A method as claimed in claim 1 wherein said step of providing said assemblies, frame and sealing layers includes the step of attaching a plurality of semiconductor chips to a bottom sealing layer having a plurality of vertically-extending walls formed therein and defining pockets so that said chips are lodged in said pockets, said walls at least partially surrounding each chip after completion of the process so that said walls serve as protective packaging for the chip.

33. A method as claimed in claim 1 wherein said step of engaging the frame, sealing layers and assemblies between top and bottom elements of a fixture includes the step of squeezing a resilient top gasket between the top element of the fixture and a portion of the top sealing layer overlying the frame, and squeezing a resilient bottom gasket between the bottom element of the fixture and a portion of the bottom sealing layer overlying the frame.

34. A method as claimed in claim 1 further comprising the step of urging a floating plate on one of said elements towards the other one of said elements so that said assemblies and regions of the sealing layers within the aperture of the frame overlying said assemblies are squeezed between the floating plate and said other one of said elements.

35. A method as claimed in claim 34 wherein said step of urging said floating plate toward the other one of said elements is performed during the step of injecting the encapsulant.

36. A method as claimed in claim 1 wherein one said sealing layer is formed from a metallic material, and wherein a portion of the metallic sealing layer remains attached to each said assembly after completion of the process, so that such portion of the sealing layer acts as a heat transfer element for the completed assembly.

37. A method of fabricating a plurality of semiconductor chip assemblies comprising the steps of:
   (a) attaching a plurality of semiconductor chips to a bottom surface of a unitary tape and electrically connecting said chips to terminals exposed at a top surface of said tape while said tape is held on a frame so as to provide a plurality of semiconductor chip assemblies, each including one or more of said chips and a region of the tape associated therewith, said chips being disposed in an aperture enclosed by said frame;
   (b) applying a top sealing layer on said top surface of said tape and on a top surface of the frame;
   (c) applying a bottom sealing layer on bottom surfaces of said chips facing away from said tape and on a bottom surface of said frame; and
   (d) injecting a liquid encapsulant around said chips so that the encapsulant contacts the chips and the tape; and
   (e) curing the encapsulant, said frame and said sealing layers confining said encapsulant during said curing step and preventing said encapsulant from contacting the bottom surfaces of the chips and the top surface of the tape.

38. A method as claimed in claim 37 further comprising the step of evacuating a space between said sealing layers around said chips prior to said injecting step.

* * * * *

UNITED STATES PATENT AND TRADEMARK OFFICE
CERTIFICATE OF CORRECTION

PATENT NO. : 6,329,224 B1  
DATED : December 11, 2001  
INVENTOR(S) : Tan Nguyen, Craig S. Mitchell and Thomas H. DiStefano It is certified that error appears in the above-identified patent and that said Letters Patent is hereby corrected as shown below:

<u>Title page,</u>
Inventors, line 2, "Distefano" should read -- DiStefano --.

Signed and Sealed this

Sixteenth Day of April, 2002

*Attest:*

JAMES E. ROGAN
*Director of the United States Patent and Trademark Office*

*Attesting Officer*